United States Patent
Okamoto et al.

(10) Patent No.: US 6,775,177 B2
(45) Date of Patent: Aug. 10, 2004

(54) SEMICONDUCTOR MEMORY DEVICE SWITCHABLE TO TWIN MEMORY CELL CONFIGURATION

(75) Inventors: Takeo Okamoto, Hyogo (JP); Tetsuichiro Ichiguchi, Hyogo (JP); Hideki Yonetani, Hyogo (JP); Tsutomu Nagasawa, Hyogo (JP); Makoto Suwa, Hyogo (JP); Zengcheng Tian, Hyogo (JP); Tadaaki Yamauchi, Hyogo (JP); Junko Matsumoto, Hyogo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/298,648

(22) Filed: Nov. 19, 2002

(65) Prior Publication Data

US 2003/0214832 A1 Nov. 20, 2003

(30) Foreign Application Priority Data

May 17, 2002 (JP) ......................................... 2002-143451

(51) Int. Cl.⁷ ............................................... G11C 11/24

(52) U.S. Cl. ....................................... 365/149; 365/222

(58) Field of Search ................................ 365/145, 149, 365/222

(56) References Cited

U.S. PATENT DOCUMENTS 6,097,662 A * 8/2000 Itou ........................ 365/230.03
6,344,990 B1 * 2/2002 Matsumiya et al. ........... 365/63
6,449,182 B1 * 9/2002 Ooishi .......................... 365/63

FOREIGN PATENT DOCUMENTS

JP 2000-40375 2/2000 ........... G11C/11/56

* cited by examiner

*Primary Examiner*—Son Mai
(74) *Attorney, Agent, or Firm*—McDermott Will & Emery LLP

(57) ABSTRACT

A row address decoder of a semiconductor memory device generates internal row address signals RAD<0:11> and /RAD<0:11> by switching most significant bit and least significant bit of row address signals RA<0:11> and /RA<0:11> that correspond to address signals A0 to A11, respectively. In a twin cell mode, the least significant bits RAD<0> and /RAD<0> of the internal row address signals corresponding to the most significant bits RA<11> and /RA<11> of the row address signal that are not used are selected simultaneously by row address decoder, and two adjacent word lines are activated simultaneously. Consequently, the configuration of memory cell in the semiconductor memory device can electrically be switched from the normal single memory cell type to the twin memory cell type.

8 Claims, 9 Drawing Sheets

US 6,775,177 B2

SEMICONDUCTOR MEMORY DEVICE SWITCHABLE TO TWIN MEMORY CELL CONFIGURATION

BACKGROUND OF THE INVENTION

1. Field of the Invention

The present invention relates to a semiconductor memory device and, more specifically, to a semiconductor memory device capable of storing memory data corresponding to 1 bit of memory information represented as binary information, using two memory cells.

2. Description of the Background Art

In a DRAM (Dynamic Random Access Memory) as a representative example of semiconductor memory devices, generally, a memory cell storing 1 bit of data has one-transistor and one-capacitor structure. As the structure of the memory cell itself is simple, it has been used in various electronic equipment as most suitable for increasing degree of integration and capacity of semiconductor devices.

FIG. 13 is a circuit diagram showing a configuration of one of the memory cells arranged in a matrix of rows and columns in a memory cell array of a DRAM, in which each memory cell storing 1 bit of data has one-transistor and one-capacitor configuration (in the following, such a DRAM will be referred to as a single memory cell type DRAM).

Referring to FIG. 13, a memory cell 100 includes an N channel MOS transistor N101 and a capacitor C101. N channel MOS transistor N101 is connected to a bit line BL and capacitor C101, and has its gate connected to a word line WL. One end of capacitor C101 different from the end connected to N channel MOS transistor N101, is connected to a cell plate 110.

N channel MOS transistor N101 is driven by a word line WL which is activated only at the time of data writing and data reading, and it is turned ON only at the time of data writing and data reading and otherwise kept OFF.

Capacitor C101 stores binary information "1" and "0" dependent on whether charges are stored or not. When data is written to capacitor C101, bit line BL is precharged in advance to a power supply voltage Vcc or the ground voltage GND, corresponding to the write data. When word line WL is activated, N channel MOS transistor N101 is turned on, and a voltage corresponding to the binary information "1" or "0" is applied from bit line BL through N channel MOS transistor N101 to capacitor C101. Thus, capacitor C101 is charged/discharged, and data is written.

When data is to be read, bit line BL is precharged in advance to a voltage Vcc/2. When word line WL is activated, N channel MOS transistor N101 is turned on, and bit line BL and capacitor C101 are conducted. Consequently, a slight change in voltage corresponding to the state of charge of capacitor C101 appears on bit line BL, and the slight change in voltage is amplified by a sense amplifier, not shown, to the voltage Vcc or to the ground voltage GND. The voltage level of bit line BL corresponds to the state of the read data.

Here, in a memory cell of a DRAM, charges in capacitor C101 that represent the stored data leak because of various factors, and are lost gradually. Specifically, the memory data is lost as time passes. Therefore, in the DRAM, before it becomes impossible to detect the change in voltage of bit line BL corresponding to the stored data in data reading, a refresh operation is executed, that is, the data is read once and written again.

Though the refresh operation is indispensable in the DRAM, it is disadvantageous in view of obtaining higher speed of operation. As a solution to this problem, a technique has been known in which a twin memory cell type memory configuration is adapted to allocate two memory cells for one bit of memory data, so that interval between refresh operations can be made longer and speed of access to the memory data can be increased.

FIG. 14 is a circuit diagram representing a configuration of memory cells arranged in a matrix of rows and columns in the memory cell array of a twin memory cell type DRAM.

Referring to FIG. 14, the memory cell in the DRAM has the twin memory cell type configuration in which two memory cells 100A and 100B are allocated for 1 bit of memory data, for storing the memory data and the inverted data thereof, respectively. Memory cell 100A includes an N channel MOS transistor N102 and a capacitor C102, and memory cell 100B includes an N channel MOS transistor N103 and a capacitor C103.

N channel MOS transistor N102 is connected to one bit line BL of paired bit lines BL, /BL and to capacitor C102, and has its gate connected to word line $WL_n$ (n is an even number not smaller than 0). N channel MOS transistor N102 is driven by word line $WL_n$ that is activated only at the time of data writing and data reading, and the transistor is turned ON only at the time of data writing and data reading and otherwise kept OFF.

N channel MOS transistor 103 is connected to the other bit line /BL of the paired bit lines BL, /BL and to capacitor C103, and has its gate connected to word line $WL_{n+1}$. N channel MOS transistor N103 is driven by word line $WL_{n+1}$ activated simultaneously with word line $WL_n$, and the transistor is turned ON only at the time of data writing and data reading, and otherwise kept OFF.

Capacitors C102 and C103 store binary information "1" and "0", dependent on whether charges are stored or not. Capacitor C103 stores inverted data of the data stored in capacitor C102. Capacitor C102 has one end connected to N channel MOS transistor N102 and another end connected to a cell plate 110. Capacitor C103 has one end connected to N channel MOS transistor N103 and another end connected to cell plate 110.

When memory data of 1 bit is to be written to capacitors C102 and C103, bit line BL is precharged to one of the power supply voltage Vcc and the ground voltage GND in correspondence with the write data, and bit line /BL is precharged to the other voltage, different from that of bit line BL. As word lines $WL_n$ and $WL_{n+1}$ are simultaneously activated, N channel MOS transistors N102 and N103 are simultaneously turned ON, a voltage corresponding to the memory data is applied from bit line BL through N channel MOS transistor N102 to capacitor C103, and a voltage corresponding to the inverted data of the memory data is applied from bit line /BL through N channel MOS transistor N103 to capacitor C103. Consequently, 1 bit of memory data is written to capacitors C102 and C103.

When the memory data is to be read, the pair of bit lines BL and /BL are both precharged in advance to the voltage Vcc/2. When word lines $WL_n$ and $WL_{n+1}$ are simultaneously activated, N channel MOS transistors N102 and N103 are simultaneously turned ON, bit line BL is conducted to capacitor C102 and bit line /BL is conducted to capacitor C103 Thus, slight changes in voltages in opposite directions to each other appear on the pair of bit lines BL and /BL, and a sense amplifier, not shown, detects potential difference between the pair of bit lines BL and /BL and amplifies the difference to the voltage Vcc or to the ground voltage GND. The amplified voltage level corresponds to the state of the read memory data.

In the twin memory cell configuration, two memory cells are allocated to 1 bit of data. Therefore, the memory cell area is surely doubled as compared with the conventional memory cell. As the two memory cells store mutually inverted information, however, the amplitude of potential difference between the pair of bit lines BL and /BL is large, and therefore operation becomes stable and interval between refresh operations can advantageously be made longer.

Further, in the present twin memory cell type DRAM, the pair of bit lines BL and /BL are precharged to the voltage ½Vcc, as in a single memory cell type DRAM described above, at the time of data reading. Here, when the memory data is read to the pair of bit lines BL and /BL, the amplitude of voltage change on the bit lines corresponding to the memory data is double that of the single memory cell type DRAM described above, as the voltages on the pair of bit lines BL and /BL change in directions opposite to each other. Thus, the twin memory cell type DRAM additionally has an advantage that high speed access to the data is possible at the time of data reading.

As described above, the single memory cell type DRAM shown in FIG. 13 and the twin memory cell type DRAM shown in FIG. 14 both have the same basic structure of memory cells, with an only difference being whether one memory cell or two memory cells are to be allocated to 1 bit of memory data. Therefore, in the process of manufacturing semiconductor memory devices, it would be convenient if the single memory cell type and twin memory cell type devices are manufactured not separately from the start and the single memory cell type devices could be switched to twin memory cell type devices in the middle of the manufacturing process, since such switching enables reduction in the number of process steps, flexibility in accordance with orders and hence possibly reduces manufacturing cost.

When the single memory cell type device is to be switched to the twin memory cell type device, switching may be possible by changing a pattern of aluminum interconnection in the step of interconnection. When this method is used, however, a separate mask pattern must be used, which means that the step of masking is also different. Therefore, sufficient reduction of manufacturing cost cannot be attained.

If electrical switching rather than structural switching of the semiconductor memory device is possible, a uniform mask pattern can be used both for the single memory cell type and twin memory cell type devices and the step of masking can be the same. Therefore, manufacturing cost can significantly be reduced.

SUMMARY OF THE INVENTION

The present invention was made to solve the above described problems and its object is to provide a semiconductor memory device that allows switching of single memory cell type configuration of memory cell to twin memory cell type configuration, with the switching performed electrically.

According to the present invention, the semiconductor memory device includes: a memory cell array including a plurality of memory cells arranged in a matrix of rows and columns; a plurality of word lines arranged in the row direction; a plurality of bit line pairs arranged in the column direction; and a decoder selecting a word line and a bit line pair corresponding to an address signal specifying each of the plurality of memory cells among the plurality of word lines and the plurality of bit line pairs, respectively, wherein the decoder selects, when a twin cell mode signal for storing memory data corresponding to 1 bit of memory information represented as binary information using two memory cells is activated, the word line and the bit line pair for activating two memory cells, and the two memory cells store memory data and inverted data of the memory data, respectively.

Preferably, the decoder generates an internal row address signal for selecting the word line corresponding to the address signal, and when the twin cell mode signal is activated, simultaneously selects a first word line corresponding to a prescribed bit of internal row address signal which is at a first logic level, and a second word line corresponding to the prescribed bit which is at a second logic level.

Preferably, the prescribed bit is the least significant bit of the internal row address signal, and the decoder allocates the most significant bit of the address signal which is not used when the twin cell mode signal is active to the least significant bit of the internal row address signal, and allocates the least significant bit of the address signal to the most significant bit of the internal row address signal.

Preferably, the semiconductor memory device further includes a refresh control circuit for periodically executing the refresh operation to retain stored information. The refresh control circuit generates a refresh row address for designating a memory cell row as an object of the refresh operation, and the refresh row address includes a partial self refresh address bit of at least 1 bit, for designating execution of the refresh operation on a part of the memory cell array. The decoder includes a selecting circuit for selecting a partial self refresh address bit of at least of 1 bit among the refresh row addresses which is differ according to whether the two cell mode signal is activated or not.

As described above, in the semiconductor memory device according to the present invention, based on a twin cell mode signal, the semiconductor memory device functioning as a common single memory cell type device is electrically switched to a semiconductor memory device functioning as a twin memory cell type device.

Therefore, by the semiconductor memory device of the present invention, it becomes unnecessary to switch and separately prepare mask patterns. Therefore, the number of masks can be reduced and the number of process steps can be reduced, enabling reduction in manufacturing cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
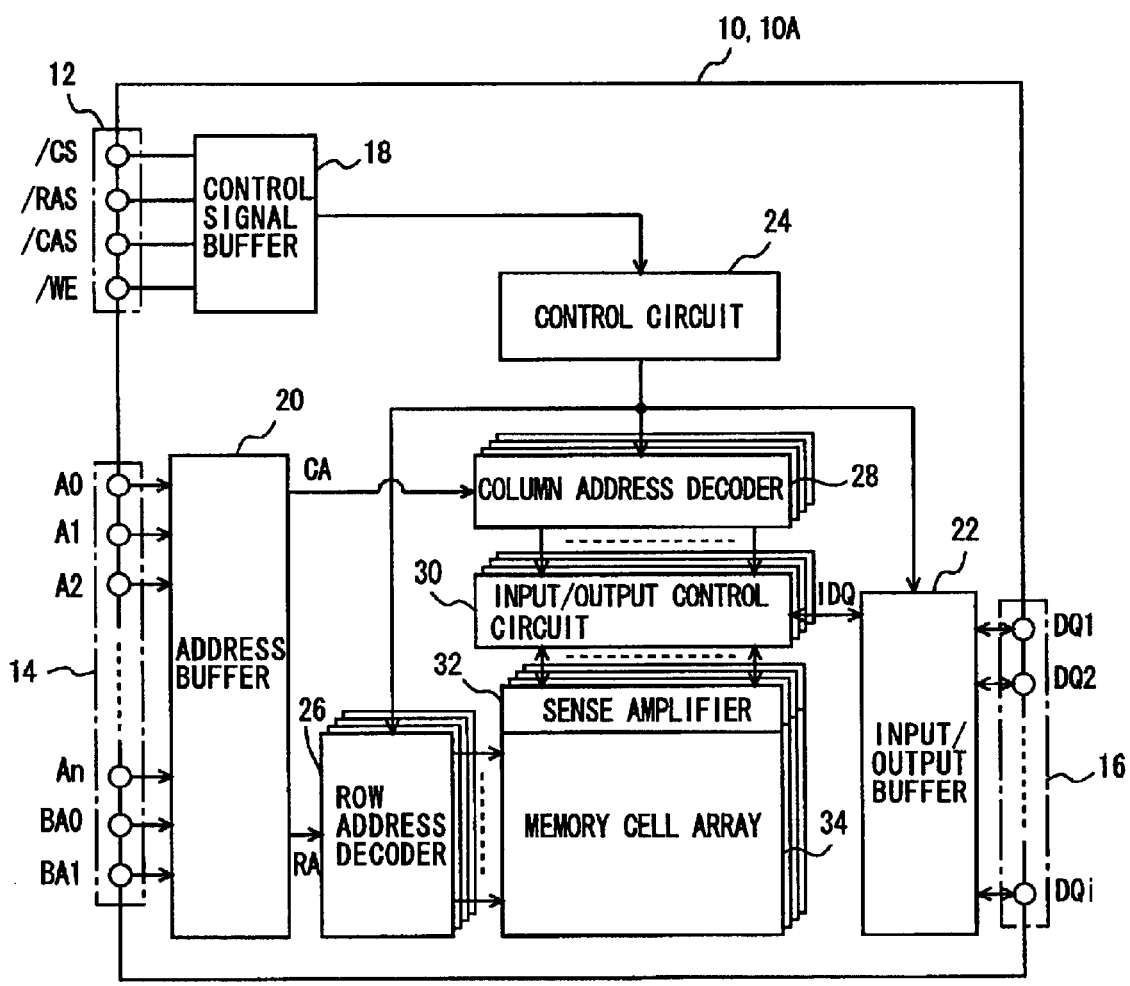
FIG. 1 is a schematic block diagram representing an overall configuration of a semiconductor memory device in accordance with a first embodiment.

In the following, embodiments of the present invention will be described in detail with reference to the figures. Throughout the figures, corresponding portions are denoted by the same reference characters and description thereof will not be repeated.

First Embodiment

FIG. 1 is a schematic block diagram representing an overall configuration of a semiconductor memory device in accordance with the first embodiment of the present invention.

Referring to FIG. 1, a semiconductor memory device 10 includes a control signal terminal 12, an address terminal 14 and a data input/output terminal 16. Further, semiconductor memory device 10 includes a control signal buffer 18, an address buffer 20 and an input/output buffer 22. Further, the semiconductor memory device 10 includes a control circuit 24, a row address decoder 26, a column address decoder 28, an input/output control circuit 30, a sense amplifier 32 and a memory cell array 34. In FIG. 1, only a main portion related to data input/output of semiconductor memory device 10 is shown as a representative.

Memory cell array 34 is a group of memory elements having memory cells arranged in a matrix of rows and columns, and consists of four banks each capable of independent operation. As the memory cell array 34 includes four banks, there are four sets of such of row address decoder 26, column address decoder 28, input/output control circuit 30 and sense amplifier 32.

Control signal terminal 12 receives command control signals including chip select signal /CS, row address strobe signal /RAS, column address strobe signal /CAS and write enable signal AVE. Control signal buffer 18 takes chip select signal /CS, row address strobe signal /RAS, column address strobe signal /CAS and write enable signal /WE from control signal terminal 12, latches the same and outputs the same to control circuit 24.

Address terminal 14 receives address signals A0 to An (n is a natural number) and bank address signals BA0 and BA1. Address buffer 20 includes a row address buffer and a column address buffer, not shown. The row address buffer of address buffer 20 takes and latches address signals A0 to An and bank address signals BA0 and BA1, and outputs row address signals RA<0:n>, /RA<0:n> (for an arbitrary table X, X<0:n> represents X<0>~X<n>) to a row address decoder 26 corresponding to the bank designated by bank address signals BA0, BA1. Further, the column address buffer of address buffer 20 takes and latches address signals A0 to An and address signals BA0 and BA1, and outputs column address signals CA<0:n>, /CA<0:n> to the column address decoder 28 corresponding to the bank designated by bank address signals BA0 and BA1.

Data input/output terminal 16 is a terminal for exchanging data read/written in semiconductor memory device 10 with the outside, and receives externally input data DQ0 to DQi (i is a natural number) at the time of data writing, and outputs to the outside data DQ0 to DQi at the time of data reading. Input/output buffer 22 takes and latches data DQ0 to DQi at the time of data writing, and provides internal data IDQ to input/output control circuit 30. Input/output buffer 22 outputs internal data IDQ received from input/output control circuit 30 to data input/output terminal 16 at the time of data reading.

Control circuit 24 takes the command control signal from control signal buffer 18, and controls, based on the taken command control signal, row address decoder 26, column address decoder 28 and input/output buffer 22.

Row address decoder 26 generates, based on the row address signals RA<0:n>, /RA<0:n> received from address buffer 20, signals RAD<0:n>, /RAD<0:n> for selecting a word line on memory cell array 34. Row address decoder 26 decodes the row address based on the signals RAD<0:n>, /RAD<0:n>, and selects the word line on memory cell array 34 corresponding to the decoded row address. By a word driver, not shown, the selected word line is activated.

Column address decoder 28 decodes the column address based on the column address signals CA<0:n>, /CA<0:n> received from address buffer 20, and selects a bit line pair on memory cell array 34 corresponding to the decoded column address.

At the time of data writing, input/output control circuit 30 outputs the internal data IDQ received from input/output buffer 22 to sense amplifier 32, and sense amplifier 32 precharges, in accordance with the logic level of internal data IDQ, the bit line pair selected by column address decoder 28 to the power supply voltage Vcc or the ground voltage GND. Consequently, internal data IDQ is written to the memory cell on memory cell array 34, which is connected to the word line activated by row address decoder 26 and the bit line pair selected by the column address decoder 28 and precharged by sense amplifier 32.

At the time of data reading, sense amplifier 32 precharges the bit line pair selected by column address decoder 28 to the voltage Vcc/2 before data reading, detects/amplifies the slight change in voltage generated corresponding to the read data in the selected bit line pair to determine the logic level of the read data, and outputs the data to input/output control circuit 30. Input/output control circuit 30 outputs the read data received from sense amplifier 32 to input/output buffer 22.

As already described, memory cell array 34 consists of four banks each of which is capable of independent operation. Each bank of memory cell array 34 is connected to row address decoder 26 through word lines arranged in the row direction on the bank, and connected to sense amplifier 32 through bit line pairs arranged in the column direction on the bank.

Figure 2:
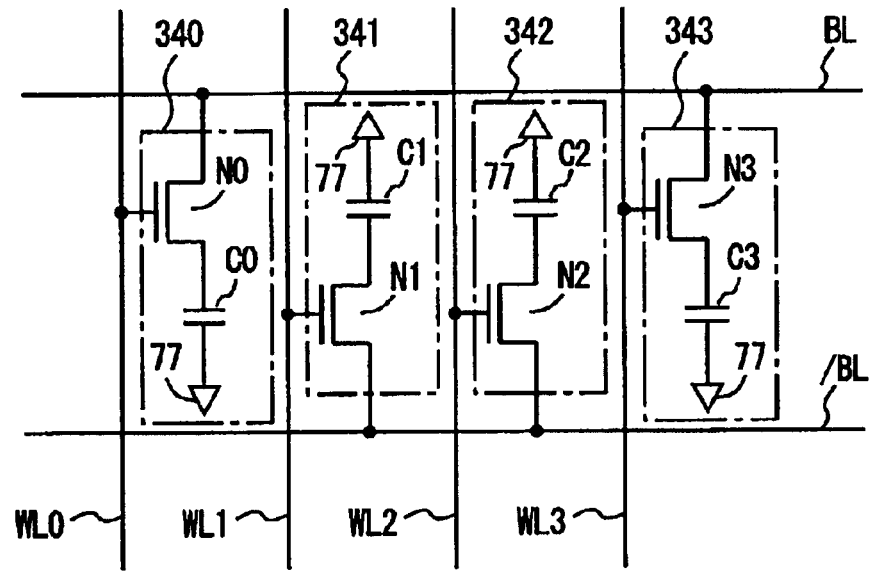
FIG. 2 is a circuit diagram representing a configuration of a memory cell arranged in the memory cell array of FIG. 1.

FIG. 2 is a circuit diagram representing a configuration of memory cells arranged in a matrix of rows and columns on the memory cell array 34 of semiconductor memory device 10. FIG. 2 shows four memory cells arranged side by side along the row direction, among the memory cells arranged on memory cell array 34.

Referring to FIG. 2, memory cell 340 includes an N channel MOS transistor N0 and a capacitor C0; memory cell 341 includes an N channel MOS transistor N1 and a capacitor C1; memory cell 342 includes an N channel MOS transistor N2 and capacitor C2; and memory cell 343 includes an N channel MOS transistor N3 and a capacitor C3.

N channel MOS transistor N0 is connected to bit line BL and capacitor C0, and has its gate connected to word line WL0. N channel MOS transistor N0 is driven by word line WL0 which is activated only at the time of data writing and data reading, and the transistor is turned ON only at the time of data writing and data reading and otherwise kept OFF.

Capacitor C0 stores binary information "1" and "0" dependent on whether charges are stored or not. Capacitor C0 has one end connected to N channel MOS transistor N0 and another end connected to a cell plate 77. Through N channel MOS transistor N0, charges are exchanged with bit line BL, and data is written to/read from capacitor C0.

N channel MOS transistor N1 is connected to bit line /BL and capacitor C1 and has its gate connected to word line WL1. N channel MOS transistor N1 is driven by word line WL1 which is activated only at the time of data writing and data reading, and the transistor is turned ON only at the time of data writing and data reading and otherwise kept OFF.

Capacitor C1 stores binary information "1" and "0" dependent on whether charges are stored or not. Capacitor C1 has one end connected to N channel MOS transistor N1 and another end connected to cell plate 77. Through the N channel MOS transistor N1, charges are exchanged with bit line /BL and data is written to/read from capacitor C1.

N channel MOS transistor N2 is connected to bit line /BL and capacitor C2 and has its gate connected to word line WL2. N channel MOS transistor N2 is driven by word line WL2 which is activated only at the time of data writing and data reading, and the transistor is turned ON only at the time of data writing and data reading and otherwise kept OFF.

Capacitor C2 stores binary information "1" and "0" dependent on whether charges are stored or not. Capacitor C2 has one end connected to N channel MOS transistor N2 and another end connected to cell plate 77. Through N channel MOS transistor N2, charges are exchanged with bit line /BL and data is written to/read from capacitor C2.

N channel MOS transistor N3 is connected to bit line BL and the capacitor C3 and has its gate connected to word line WL3. N channel MOS transistor N3 is driven by word line WL3 which is activated only at the time of data writing and data reading, and the transistor is turned ON only at the time of data writing and data reading and otherwise kept OFF.

Capacitor C3 stores binary information "1" and "0" dependent on whether charges are stored or not. Capacitor C3 has one end connected to N channel MOS transistor N3 and another end connected to cell plate 77. Through N channel MOS transistor N3, charges are exchanged with bit line BL and data is written to/read from capacitor C3.

When the semiconductor memory device 10 functions as a single memory cell type semiconductor memory device, 1 bit of data is stored in each of memory cells 340 to 343. When data is written to/read from each of memory cells 340 to 343, corresponding one of word lines WL0 to WL3 is activated, and charges are exchanged with the bit line BL or bit line /BL to which the memory cell is connected.

When semiconductor memory device 10 functions as a twin memory cell type semiconductor memory device, 1 bit of data is stored by adjacent memory cells 340 and 341, and 1 bit of data is stored by adjacent memory cells 342, 343. Memory cell 341 stores the data which is the memory data of memory cells 340 with the logic level inverted, and memory cell 343 stores the data which is the memory data of memory cell 342 with the logic level inverted.

When data is written to the memory cells 340 and 341 constituting the twin memory cells, the bit line BL is precharged to a prescribed voltage corresponding to the memory data, and the bit line /BL is precharged to a prescribed voltage corresponding to the inverted data of the memory data. Word lines WL0 and WL1 are activated simultaneously, charges corresponding to the memory data are supplied from bit line BL to capacitor C0, and charges corresponding to the inverted data of the memory data are supplied from bit line /BL to capacitor C1.

When data is written to memory cells 342 and 343 constituting the twin memory cells, bit line BL is precharged to a prescribed voltage corresponding to the memory data, and bit line /BL is precharged to a prescribed voltage corresponding to the inverted data of the memory data. Word lines WL2 and WL3 are activated simultaneously, charges corresponding to the memory data are supplied from bit line BL to capacitor C2, and charges corresponding to the inverted data of memory data are supplied from bit line /BL to capacitor C3.

In this manner, when semiconductor memory device 10 is used as the twin memory cell type device, data inverted with respect to each other are written to the pair of bit lines BL and /BL, and by simultaneously activating adjacent word lines, two memory cells next to each other along the row direction store one bit of data.

Figure 3:
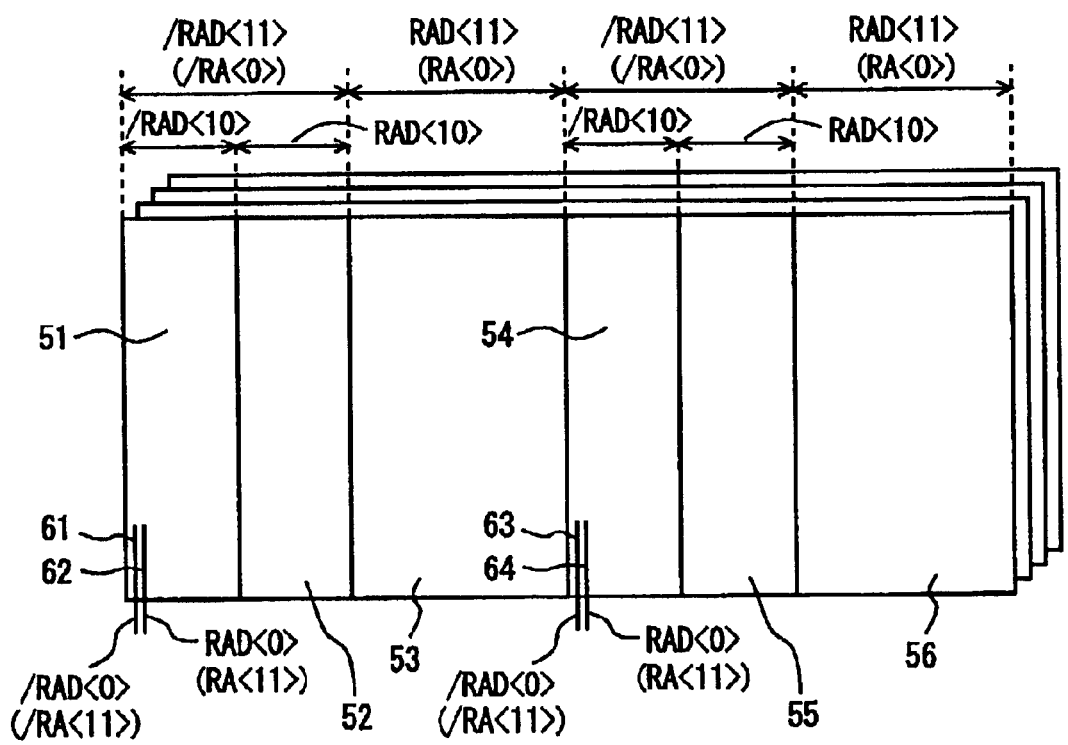
FIG. 3 is a schematic illustration representing a configuration of a memory area in each bank of the memory cell array shown in FIG. 1.

FIG. 3 is a schematic illustration representing the memory area configuration in each bank of memory cell array 34. In the following, it is assumed that when semiconductor memory device 10 operates as a normal single memory cell type semiconductor memory device, the storage capacity is 128M (mega) bits, and the semiconductor memory device functions as a device having the "×32" word configuration. Namely, when the semiconductor memory device 10 is used as the normal single memory cell type device, the most significant bit of the address signal An is A11 (n=11).

Referring to FIG. 3, each bank of memory cell array 34 has areas 51 to 56, and by all the areas, provide the storage capacity of 32M bits (=128M bits/4 banks). Each bank of memory cell array 34 has 8192 word lines arranged thereon, and a prescribed word line is selected based on the signals RAD<0:11>, /RAD<0:11>. The row address signals RA<11> and /RA<11> correspond to externally designated address signals A0 to A11, respectively. Row address signal RA<11> and /RA<11> represent the most significant bit of the row address, while row address signals RA<0> and /RA<0> represent the least significant bit of the row address.

Memory areas 51 to 53 and memory areas 54 to 56 have the same memory configurations, and based on the signals RAD<0:11> and /RAD<0:11>, word lines at the relatively same position in respective areas are selected.

Areas 51, 52 and 54, 55 are selected by the logic level of the signal /RAD <11>, and areas 53, 56 are selected by the logic level of the signal RAD<11>. When areas 51, 52 and areas 54, 55 are selected by the signal /RAD<11>, areas 51 and 54 are selected in accordance with the logic level of signal /RAD<10>, and areas 52, 55 are selected in accordance with the logic level of signal RAD<10>. Similarly, by the lower bits of signals RAD<0:11> and /RAD<0:11>, areas of smaller division are selected, and finally, by the signals RAD<0:11> and /RAD<0:11>, the designated word line is selected.

In the semiconductor memory device 10, when the signals RAD<0:11> and /RAD<0:11> are generated based on the row address signals RA<0:11> and /RA<0:11>, the most significant bit and the least significant bit of row address signals RA<0:11> and /RA<0:11> are switched, to provide signals RAD<0:11> and /RAD<0:11>. More specifically, the most significant bits RA<11> and /RA<11> of the row address are allocated to the least significant bits RAD<0> and /RAD<0> of the signals RAD<0:11> and /RAD<0:11>, respectively, and the least significant bits RA<0> and /RA<0> of the row address are allocated to the most significant bits RAD<11> and /RAD<11> of the signals RAD<0:11> and /RAD<0:11>, respectively.

When the semiconductor memory device 10 functions as a twin memory cell type semiconductor memory device having the storage capacity of 64M bits and "×32" word configuration, the least significant bits RAD<0> and /RAD<0> are both selected when the signals RAD<0:11> and /RAD<0:11> are generated. Thus, adjacent word lines 61 and 62 and word lines 63 and 64 are simultaneously connected as shown in FIG. 3, and adjacent memory cells are selected simultaneously, providing the twin memory cells, as described with respect to FIG. 2.

When the semiconductor memory device 10 functions as a twin memory cell type semiconductor memory device having storage capacity of 64M bits and "×32" word configuration, the most significant bits of the row address signals are RA<10> and /RA<10>, and row address signals RA<11> and /RA<11> are not used. Therefore, when signals RAD<0> and /RAD<0> corresponding to the row address signals RA<11> and /RA<11> are rewritten inside the semiconductor memory device 10, there would be no problem in address designation.

Figure 4:
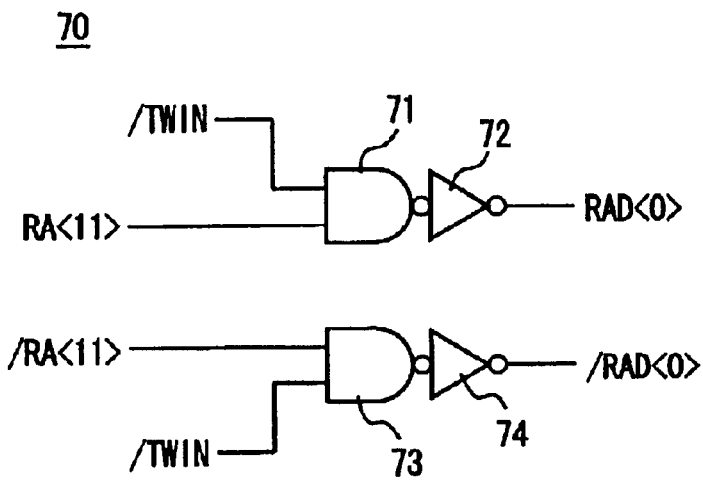
FIG. 4 is a circuit diagram representing a circuit configuration of an RAD<0> generating circuit included in the row address decoder of FIG. 1.

FIG. 4 is a circuit diagram representing a circuit configuration of RAD<0> generating circuit that generates least significant bits RAD<0> and /RAD<0> of the signals RAD<0:11> and /RAD<0:11>, included in row address decoder 26.

Referring to FIG. 4, RAD<0> generating circuit includes an NAND gate 71 receiving a twin cell mode signal /TWIN and the most significant bit RA<11> of the row address; an inverter 72 inverting an output of NAND gate 71 and outputting signal RAD<0>; an NAND gate 73 receiving twin cell mode signal /TWIN and the most significant bit/RA<11> of the row address; and an inverter 74 inverting the output of NAND gate 73 and outputting the signal /RAD<0>.

Twin cell mode signal /TWIN has its logic level set to L (logic low) when the semiconductor memory device 10 functions as a twin cell memory cell type semiconductor memory device. The logic level is set during manufacturing of semiconductor memory device 10, by wiring the signal line for the twin cell mode signal /TWIN with the power supply node or wiring the signal line with the ground node. When the twin cell mode signal /TWIN is at the L level, NAND gates 71, 73 provide H level signals regardless of the logic levels of row address signals RA<11> and /RA<11>, respectively, and hence the least significant bits RAD<0> and /RAD<0> are selected (the least significant bits RAD<0> and /RAD<0> are at the logic level of L, selected).

The twin cell mode signal /TWIN has been described as generated by bonding-switching of the signal lines in the foregoing. The signal, however, may be set as one of externally applied commands, or a dedicated terminal may be provided. Alternatively, a fuse circuit may be provided internally, and the twin cell mode signal /TWIN may be set by blowing or not blowing the fuse element of the fuse circuit during manufacturing.

As described above, in the semiconductor memory device 10 of the first embodiment, adjacent word lines are activated simultaneously in response to the twin cell mode signal, and the semiconductor memory device is electrically switched from the single memory cell type to the twin memory cell type. Therefore, it becomes unnecessary to switch and separately prepare mask patterns in the step of masking, and therefore, manufacturing cost can be reduced through reduced number of masks and reduced number of manufacturing steps.

Second Embodiment

The semiconductor memory device 10 in accordance with the first embodiment can be switched from a single memory cell type semiconductor memory device having storage capacity 128M bits and "×32" word configuration to a twin memory cell type semiconductor memory device having storage capacity of 64M bits and "×32" word configuration. The semiconductor memory device 10A in accordance with the second embodiment further allows switching to a twin memory cell type semiconductor memory device having storage capacity of 64M bits and "×16" word configuration.

As already described, refresh operation is indispensable in the DRAM, and in the refresh operation, data reading, amplification and rewriting are executed in each of the memory cells as the object of refreshing, and the memory data is retained. The refresh operation is executed word line by word line arranged on the memory cell array, and the operation period (hereinafter referred to as a refresh period) is determined in consideration of the refresh interval ensuring data retention in each memory cell and the number of word lines.

Again referring to FIG. 3, when refresh operation is performed in each bank of memory cell array 34 of semiconductor memory device 10 in accordance with the first embodiment, based on the row address signals RA<0:11> and /RA<0:11> generated based on the address signals A0 to A11 received at address terminal 14, 4096 word lines in each of the areas 51 to 53 and 54 to 56 are successively activated in each of the areas 51 to 53 and 54 to 56. Specifically, all the memory cells are refreshed by 4096 refresh operations (in the following, an example which requires 4096 refresh operations to complete refreshing of all memory cells will be referred to as "4K refresh" and an example that requires 8192 refresh operations to complete refreshing of all memory cells with all of 8192 word lines in areas 51 to 56 being activated successively will be referred to as "8K refresh").

Semiconductor memory device 10A in accordance with the second embodiment allows 8K refresh, and in order to successively select 8192 word lines, row address signals RA<12> and /RA<12> are further provided. At the time of refresh operation, based on the row address signals RA<0:12> and /RA<0:12>, 8192 word lines are successively activated in each bank of memory cell array 34, and all the memory cells are refreshed by 8192 operations.

In semiconductor memory device 10A, the most significant bits RA<12> and /RA<12> are allocated to least significant bits RAD<0> and /RAD<0> of the signals RAD<0:12> and /RAD<0:12>, and when the semiconductor memory device 10A functions as a twin memory cell type semiconductor memory device, the least significant bits RAD<0> and /RAD<0> are both activated, as in the semiconductor memory device 10 in accordance with the first embodiment, whereby the semiconductor device also functions as a device having storage capacity of 64M bits and "×16" word configuration.

The reason why this is possible is as follows. When semiconductor memory device 10A functions as a twin memory cell type semiconductor memory device having storage capacity of 64M bits and "×16" word configuration, the most significant bits of the row address signal are RA<11> and /RA<11>, and row address signals RA<12> and /RA<12> are not used. Therefore, even when signals RAD<0> and /RAD<0> corresponding to the row address signals RA<12> and /RA<12> are rewritten in semiconductor memory device 10A, there is no problem in address designation.

The overall configuration of semiconductor memory device 10A in accordance with the second embodiment is the same as that of semiconductor memory device 10 in accordance with the first embodiment shown in FIG. 1. Therefore, description thereof will not be repeated.

Figure 5:
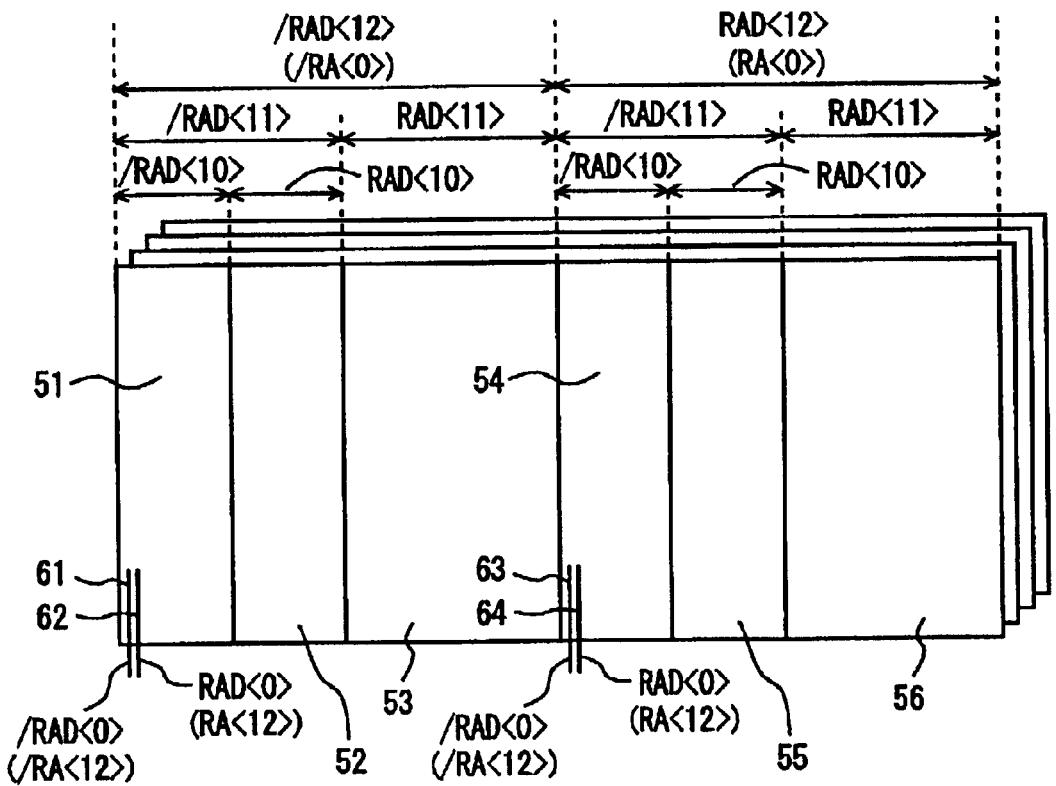
FIG. 5 is a schematic illustration representing a configuration of a memory area in each bank of the memory cell array of the semiconductor memory device in accordance with a second embodiment.

FIG. 5 is a schematic illustration of the memory area in each bank of memory cell array 34 of the semiconductor memory device 10A.

Referring to FIG. 5, in each bank of memory cell array 34 of semiconductor memory device 10A, different from the bank of memory cell array 34 of semiconductor memory device 10 shown in FIG. 3, areas 51 to 53 are further selected by the logic level of signal /RAD<12> and areas 54 to 56 are further selected by the logic level of signal RAD<12>.

Here, in semiconductor memory device 10A, when signals RAD<0:12> and /RAD<0:12> are generated based on the row address signals RA<0:12> and /RA<0:12>, the most significant bits and the least significant bits of row address signals RA<0:12> and /RA<0:12> are switched, and signals RAD<0:12> and /RAD<0:12> are generated. More specifically, most significant bits RA<12> and /RA<12> of the row address are allocated to the least significant bits RAD<0> and /RAD<0> of the signals RAD<0:12> and /RAD<0:12>, and the least significant bits RA<0> and /RA<0> of the row address are allocated to the most significant bits RAD<12> and /RAD<12> of the signals RAD<0:12> and /RAD<0:12>, respectively.

When semiconductor memory device 10A functions as a twin memory cell type semiconductor memory device having storage capacity of 64M bits and "×16" word configuration, least significant bits RAD<0> and /RAD<0> are both always selected when the signals RAD<0:12> and /RAD<0:12> are generated. Thus, adjacent word lines 61 and 62 and word lines 63 and 64 are simultaneously selected, and the adjacent memory cells are simultaneously selected to form the twin memory cells, as shown in FIG. 5.

As described above, in the semiconductor memory device 10A in accordance with the second embodiment, using most significant bits RA<12> and /RA<12> provided for 8K refresh, adjacent word lines can simultaneously can be activated. Therefore, switching from a single memory cell type semiconductor memory device to a twin memory cell type semiconductor memory device having storage capacity of 64M bits and "×16" word configuration can also be realized electrically.

Third Embodiment

The semiconductor memory device in accordance with the third embodiment corresponds to the semiconductor memory device 10A in accordance with the second embodiment, has the self refresh function, and further has the function of refreshing only a part of the memory area, that is, a so-called partial self refresh function.

As described above, in the refresh operation, in each of the memory cells as the object of refreshing, data reading, amplification and rewriting are executed periodically, and the memory data is retained. The refresh operation is executed word line by word line.

In self refresh, row addresses for selecting the word line as the object of refreshing is internally generated and the refresh operation is performed. In partial self refresh, the refresh operation is executed only in that memory area for which the most significant 1 bit or 2 bits of the row address have the logic level, for example, of L level.

Therefore, in order that a prescribed part of the areas is to be properly refreshed in partial self refresh, it becomes necessary to establish correspondence of the most significant bit of different row address to the refresh space for the partial self refresh, dependent on whether the semiconductor memory device functions as a single memory cell type semiconductor memory device or a twin memory cell type semiconductor memory device and further, whether the device allows 8K refresh.

Figure 6:
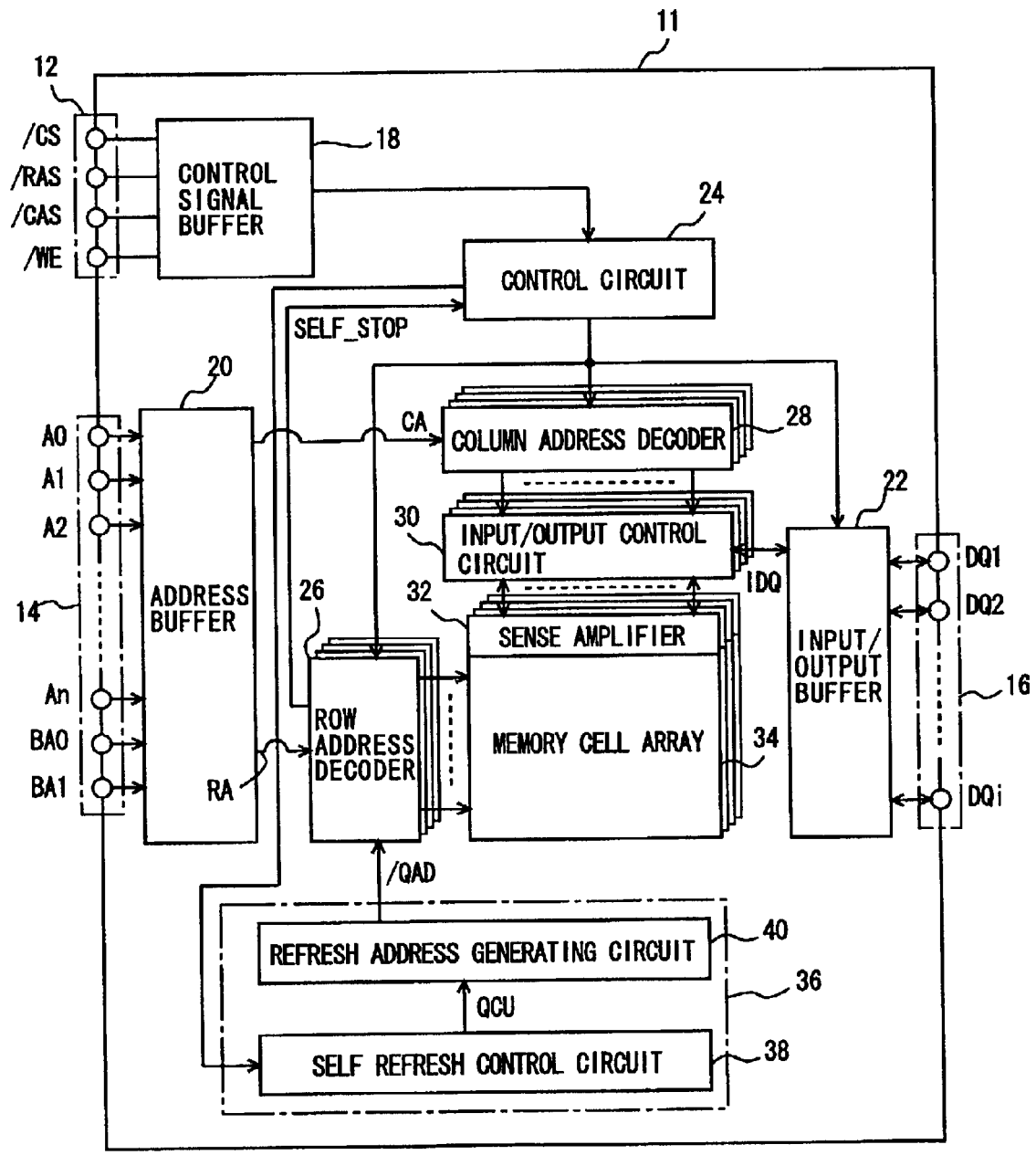
FIG. 6 is a schematic block diagram representing an overall configuration of a semiconductor memory device in accordance with a third embodiment.

FIG. 6 is a schematic block diagram representing an overall configuration of the semiconductor memory device in accordance with the third embodiment of the present invention.

Referring to FIG. 6, a semiconductor memory device 11 includes, in addition to the components of semiconductor memory device 10A of the second embodiment, a refresh control circuit 36. Refresh control circuit 36 includes a self refresh control circuit 38 and a refresh address generating circuit 40.

Refresh control circuit 36 generates a row address for performing the refresh operation (hereinafter referred to as a refresh row address signal /QAD<0:n>) based on an instruction from control circuit 24, and outputs the address to row address decoder 26. Row address decoder 26 selects a word line in memory cell array 34 based on the row address signals RA<0:n> and /RA<0:n> received from address buffer 20 in normal operation, based on an instruction from control circuit 24. In the self refresh mode, row address decoder 26 selects a word line in memory cell array 34 based on the refresh row address signal /QAD<0:n> received from refresh control circuit 36.

Self refresh control circuit 38 generates a refresh signal QCU based on a pulse signal generated by an oscillation circuit, not shown, and outputs the generated refresh signal QCU to refresh address generating circuit 40. Refresh signal QCU is activated in every prescribed refresh period, which period is determined considering refresh interval that ensures data retention in each memory cell of memory cell array 34 and the number of word lines in memory cell array 34.

Refresh address generating circuit 40 updates the refresh row address in response to the refresh signal QCU, and successively switches the memory cell row as the object of the refresh operation. Specifically, the refresh row address signal /QAD<0:n> is counted up in response to the refresh signal QCU.

As described above, semiconductor memory device 11 in accordance with the third embodiment has a function of performing the refresh operation not on the entire memory area as an object but only a part of the memory area as an object in the self refresh mode, that is, a so-called partial self refresh function, in order to reduce power consumption in the standby mode.

In the partial self refresh, in each of the banks of memory cell array 34, only that memory area is refreshed for which the most significant 1 bit or most significant 2 bits of the refresh row address signal /QAD<0:n> are at the L level. This enables reduction in power consumption in the standby mode, while not making longer the refresh period.

In the semiconductor memory device 11, the most significant bit of the row address, which differs according to whether the device functions as a formal single memory cell type semiconductor memory device or a twin memory cell type semiconductor memory device, and further whether the device has the 8K refresh function, is properly allocated to the refresh space for the partial self refresh in accordance with respective mode of use.

Figure 7:
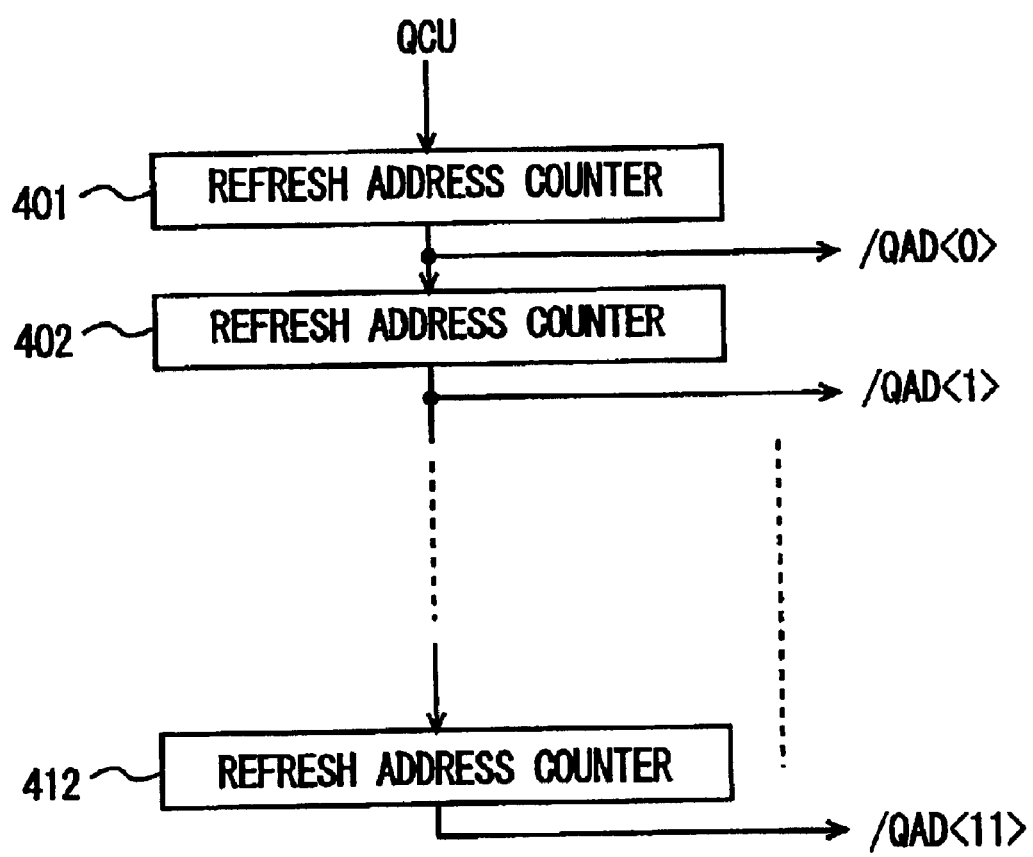
FIG. 7 is a functional block diagram functionally representing a refresh address generating circuit of FIG. 6.

FIG. 7 is a functional block diagram illustrating, functionally, the refresh address generating circuit 40 shown in FIG. 6.

Referring to FIG. 7, refresh address generating circuit 40 includes refresh address counters 401 to 412. The refresh address counter 401 corresponding to the least significant bit performs counting-up operation in response to the refresh signal QCU output from self refresh control circuit 38, and outputs the count data as the refresh row address signal /QAD<0>.

Each of the refresh address counters 402 to 412 performs count-up operation in accordance with the count data output from the refresh address counter on the lower bit side, and outputs the count data as refresh row address signals/QAD<1> to/QAD<11>.

In this manner, at the time of self refresh, the self refresh row address signal /QAD<0:11> is generated for successively selecting each row of memory cells at every prescribed refresh period.

Figure 8:
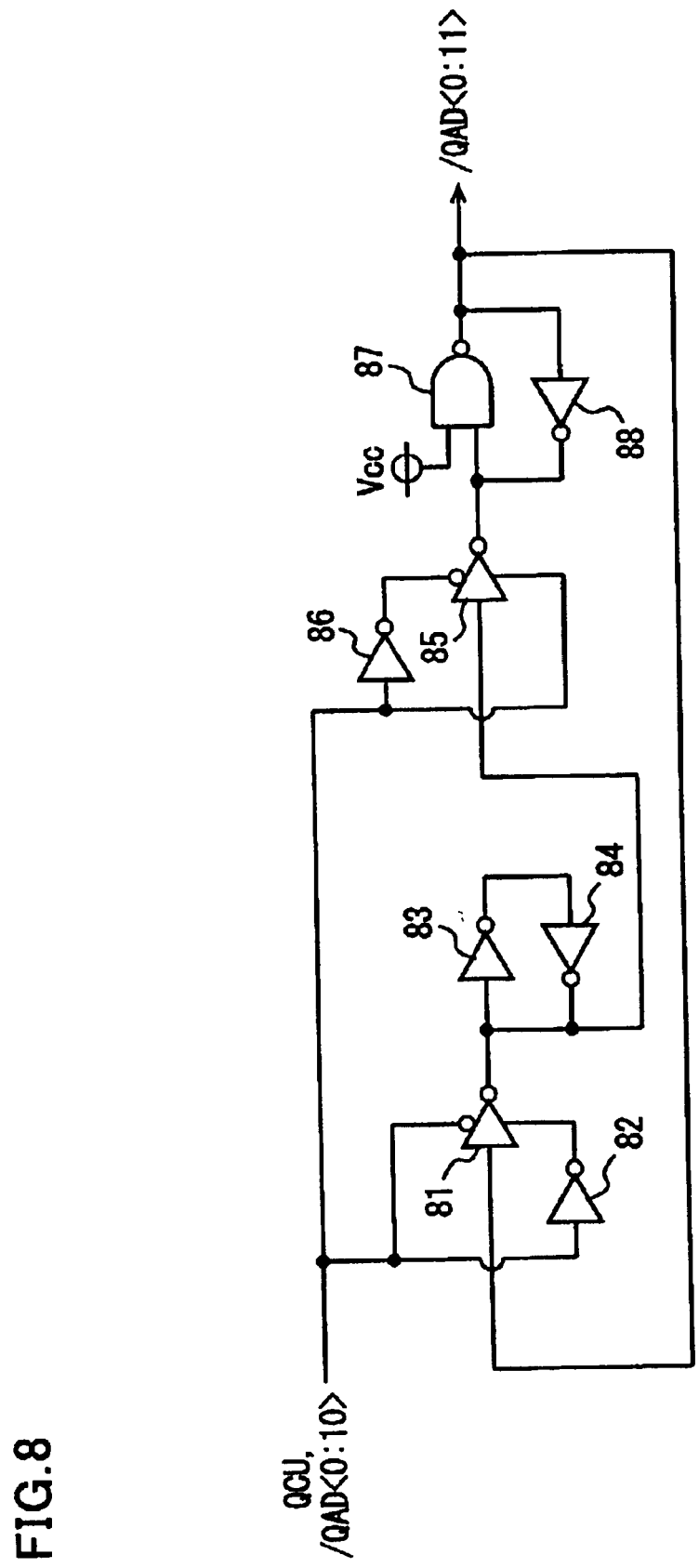
FIG. 8 is a circuit diagram representing a circuit configuration of a refresh address counter shown in FIG. 7.

FIG. 8 is a circuit diagram representing a circuit configuration of refresh address counters 401 to 412.

Referring to FIG. 8, each of the refresh address counters 401 to 412 includes inverters 82 and 86 inverting an input signal; an inverter 81 activated when logic level of the input signal is the L level, for receiving and inverting an output signal; inverters 83 and 84 forming a latch circuit latching an output of inverter 81; an inverter 85 activated when the logic level of the input signal is the H level, for receiving and inverting an output of inverter 81; an NAND gate 87 having input nodes connected to a power supply node and to an output node of inverter 85; and an inverter 88 forming, together with NAND gate 87, a latch circuit for inverting and latching an output of inverter 85.

In each of the refresh address counters 401 to 412, when the logic level of the output signal is at the L level and the input signal is at the L level, inverter 81 is activated, and an output of inverter 81 attains to the H level. In this stage, inverter 85 is not activated, and the output of inverter 81 is not transmitted to the output node of inverter 85.

Then, when the logic level of the input signal attains to the H level, inverter 81 is inactivated, while the output of inverter 81 is latched by inverters 83 and 84. Inverter 85 is activated, and inverter 85 inverts the H level input and outputs an L level signal. Therefore, NAND gate 87 outputs a signal at the H level, and the output is latched by NAND gate 87 and inverter 88.

Thereafter, when the logic level of the input signal attains to the L level, inverter 81 is activated, and the output of inverter 81 attains to the L level. Inverter 85 is inactivated, and the output of inverter 81 is not transmitted to the output node of inverter 85.

Thereafter, when the logic level of the input signal attains to the H level, inverter 81 is inactivated, while the output of inverter 81 is latched by inverters 83 and 84. Inverter 85 is activated, and inverter 85 inverts the L level input and outputs an H level signal. Therefore, NAND gate 87 outputs the L level signal, and the output is latched by NAND gate 87 and inverter 88.

In this manner, each of the refresh address counters 401 to 412 outputs an output signal of which period is ½ of the input signal, and the refresh row address signal /QAD<0:11> is counted up.

Figure 9:
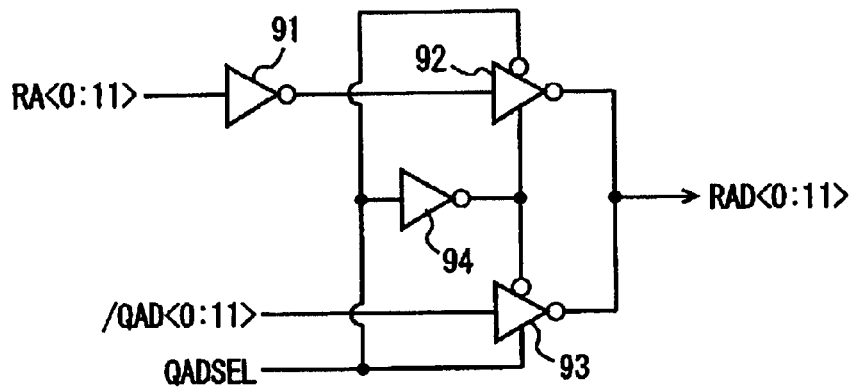
FIG. 9 is a circuit diagram representing a circuit configuration of an address selecting circuit included in a row address decoder shown in FIG. 6.

FIG. 9 is a circuit diagram representing a circuit configuration of the address selecting circuit included in row address decoder 26. The address selecting circuit selects, in response to the self refresh mode signal QADSEL received from control circuit 24, either the refresh row address signal /QAD<0:11> or the row address signal RA<0:11> received from address buffer 20 and outputs the selected one as the signal RAD<0:11>.

In FIG. 9, for convenience of description, respective bit data for the input signals and output signals other than the self refresh mode signal QADSEL are denoted collectively, and the signals will be described in general as signals for collective bit data in the following. Actually, however, circuits are provided for each of the bit data.

Referring to FIG. 9, the address selecting circuit includes an inverter 91 receiving and inverting row address signal RA<0:11>; an inverter 94 receiving and inverting self refresh mode signal QADSEL; an inverter 93 activated when the self refresh mode signal QADSEL is at the H level and inverting refresh row address signal /QAD<0:11> and outputting a signal RAD<0:11>; and an inverter 92 activated when the self refresh mode signal QADSEL is at the L level, and inverting an output of inverter 91 and outputting the signal RAD<0:11>.

The self refresh mode signal QADSEL attains to the H level in the self refresh mode, which is generated by control circuit 24.

The address selecting circuit outputs, when the self refresh mode signal QADSEL is at the H level, the signal obtained by inverting refresh row address signal /QAD<0:11> as the signal RAD<0:11>. When the self refresh mode signal QADSEL is at the L level, the address selecting circuit outputs the row address signal RA<0:11> as the signal RAD<0:11>.

Figure 10:
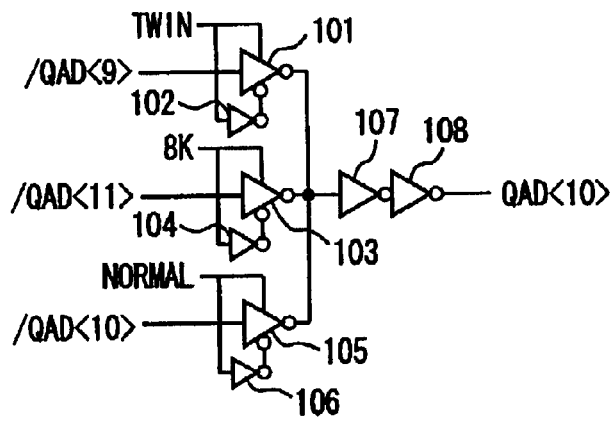
FIG. 10 is a circuit diagram representing a configuration of a circuit for selecting a second most significant bit in accordance with the mode of use.
Figure 11:
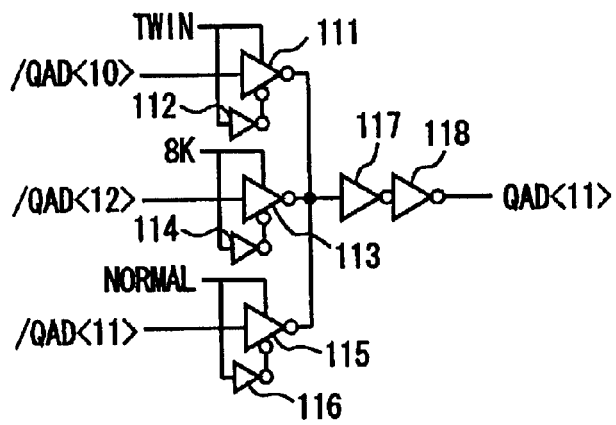
FIG. 11 is a circuit diagram representing a configuration of a circuit for selecting the most significant bit in accordance with the mode of use.
Figure 12:
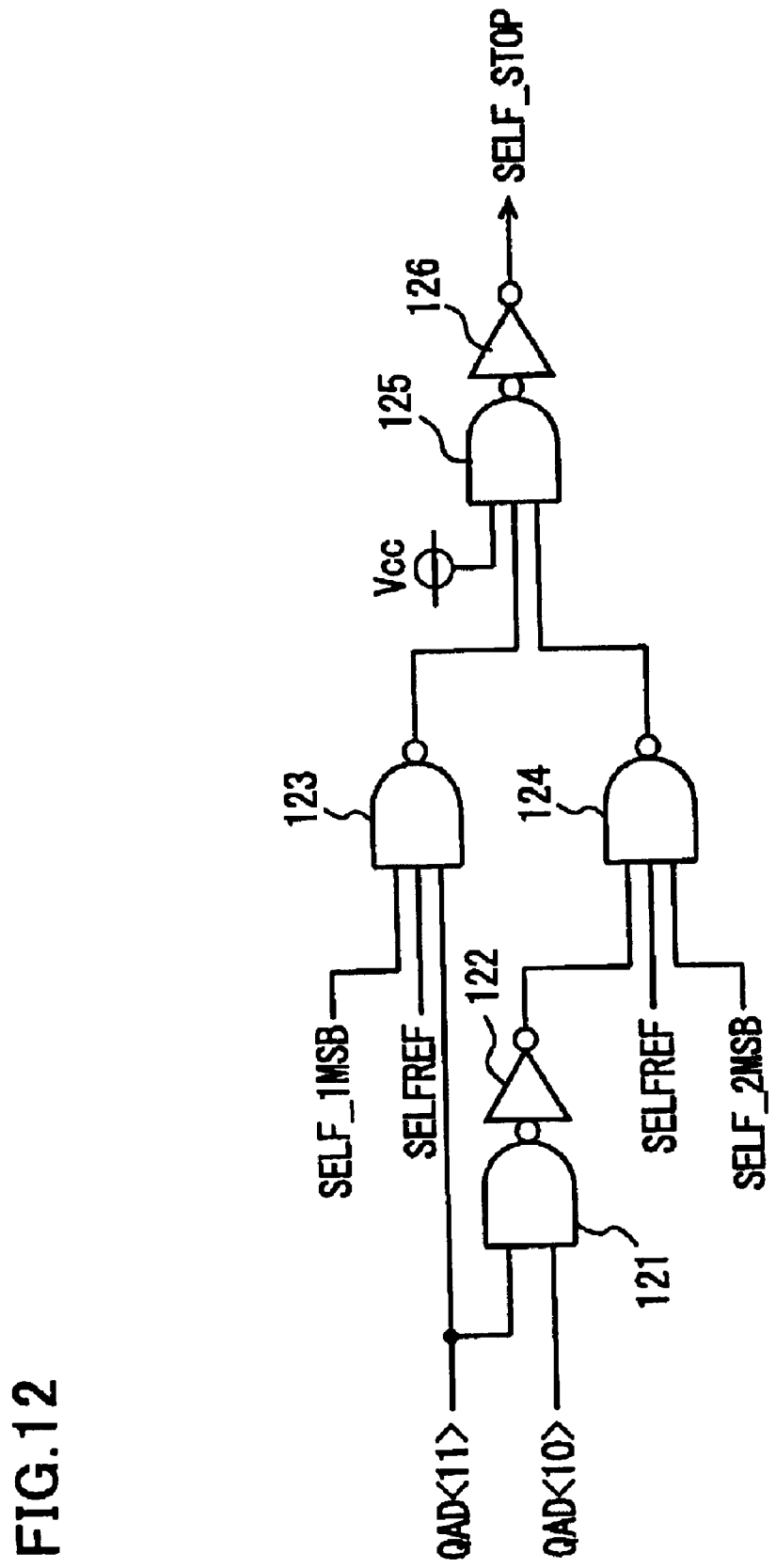
FIG. 12 is a circuit diagram representing a configuration of a circuit generating a self refresh stop signal for stopping self refresh operation.
Figure 13:
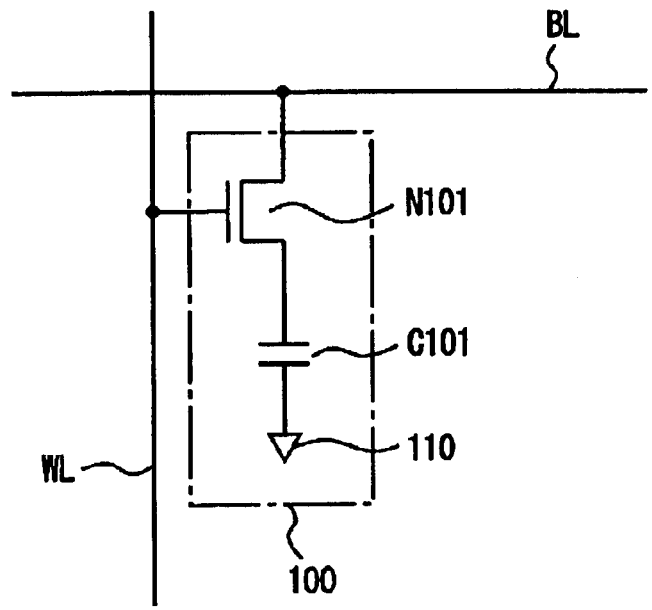
FIG. 13 is a circuit diagram representing a memory cell configuration arranged in a matrix of rows and columns on a memory cell array of a single memory cell type DRAM.
Figure 14:
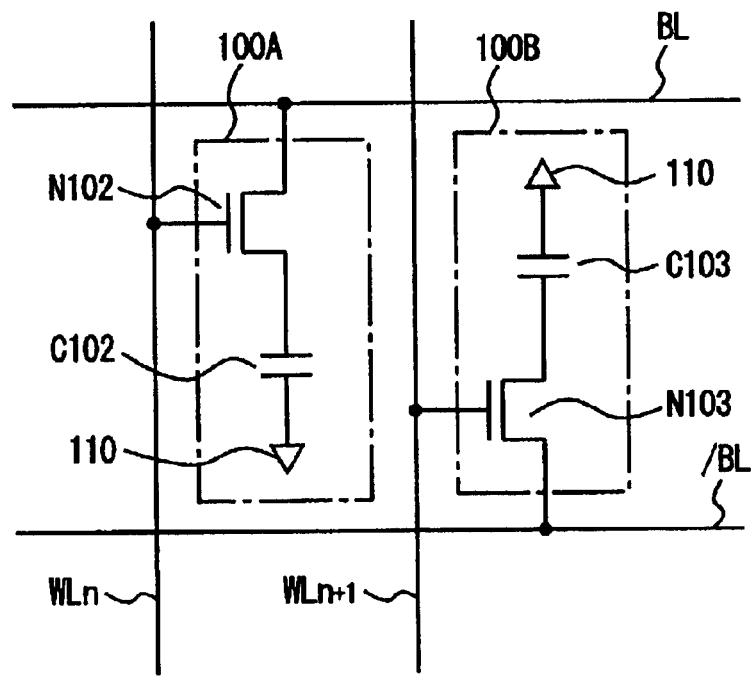
FIG. 14 is a circuit diagram representing a memory cell configuration arranged in a matrix of rows and columns on a memory cell array of a twin memory cell type DRAM.

The circuits shown in FIGS. 10 to 12 are circuits included in row address decoder 26, for establishing correspondence between the upper bits of the row address with the refresh space of the partial self refresh, in accordance with the mode of use in the semiconductor memory device 11. FIG. 10 is a circuit diagram representing a configuration of a circuit for selecting the second most significant bit of the row address in accordance with the mode of use. FIG. 11 is a circuit diagram representing a configuration of a circuit for selecting the most significant bit of the row address in accordance with the mode of use. FIG. 12 is a circuit diagram representing a configuration of a circuit for generating a self refresh stop signal, for stopping the self refresh operation.

Here, the modes of use include the normal mode in which semiconductor memory device 11 functions as a normal single memory cell type semiconductor memory device, a twin cell mode in which semiconductor memory device 11 functions as a twin memory cell type semiconductor memory device, and a 8K refresh mode in which semiconductor memory device 11 performs the 8K refresh operation.

In the normal mode, the most significant bit of the refresh row address is/QAD<11>, in the twin cell mode, the most significant bit of the refresh row address is/QAD<10>, and in the 8K refresh mode, the most significant bit of the refresh row address is/QAD<12>.

Referring to FIG. 10, the circuit includes an inverter 102 receiving and inverting the twin cell mode signal TWIN; an inverter 101 activated when the twin cell mode signal TWIN is at the H level, and receiving and inverting the refresh row address signal /QAD<9>; an inverter 104 receiving and inverting the 8K refresh mode signal 8K; an inverter 103 activated when the 8K refresh mode signal 8K is at the H level, and receiving and inverting the refresh row address signal /QAD<11>; an inverter 106 receiving and inverting the normal mode signal NORMAL; an inverter 105 activated when the normal mode signal NORMAL is at the H level, and receiving and inverting the refresh row address signal /QAD<10>; an inverter 107 receiving and inverting outputs of inverters 101, 103 and 105; and an inverter 108 receiving and inverting an output of inverter 107 and outputting a signal QAD<10>.

When the semiconductor memory device 11 functions as a twin memory cell type semiconductor memory device and the twin cell mode signal TWIN is at the H level, the circuit outputs a signal obtained by inverting the refresh row address signal /QAD<9> as the signal QAD<10>. When the semiconductor memory device 11 operates for 8K refresh and the 8K refresh mode signal 8K is at the H level, the circuit outputs the signal obtained by inverting the refresh row address signal /QAD<11> as the signal QAD<10>. Further, when the semiconductor memory device 11 functions as the normal single memory cell type semiconductor memory device and the normal mode signal NORMAL is at the H level, the circuit outputs the signal obtained by inverting the refresh row address signal /QAD<10> as the signal QAD<10>.

Referring to FIG. 11, the circuit includes an inverter 112 receiving and inverting the twin cell mode signal TWIN; an inverter 111 activated when the twin cell mode signal TWIN is at the H level, and receiving and inverting the refresh row address signal /QAD<10>; an inverter 114 receiving and inverting the 8K refresh mode signal 8K; an inverter 113 activated when the 8K refresh mode signal 8K is at the H level, and receiving and inverting the refresh row address signal /QAD<12>; an inverter 116 receiving and inverting the normal mode signal NORMAL; an inverter 115 activated when the normal mode signal NORMAL is at the H level, and receiving and inverting the refresh row address signal /QAD<11>; an inverter 117 receiving and inverting outputs of inverters 111, 113 and 115; and an inverter 118 receiving and inverting an output of inverter 117 and outputting the signal QAD<11>.

When the semiconductor memory device 11 functions as the twin memory cell type semiconductor memory device and the twin cell mode signal TWIN is at the H level, the circuit outputs the signal obtained by inverting the refresh row address signal /QAD<10> as the signal QAD<11>. When the semiconductor memory device 11 operates for the 8K refresh and the 8K refresh mode signal 8K is at the H level, the circuit outputs the signal obtained by inverting the refresh row address signal /QAD<12> as the signal QAD<11>. Further, when the semiconductor memory device 11 functions as a normal single memory cell type semiconductor memory device and the normal mode signal NORMAL is at the H level, the circuit outputs the signal obtained by inverting the refresh row address signal /QAD<11> as the signal QAD<11>.

Referring to FIG. 12, the circuit includes an NAND gate 123 receiving the signals SELF_1MSB, SELFREF and QAD<11>; an NAND gate 121 receiving signals QAD<11> and QAD<10>; an inverter 122 receiving and inverting an output of NAND gate 121; an NAND gate 124 receiving an output of inverter 122 and signals SELFREF and SELF_2MSB; an NAND gate 125 having an input gate connected to a power supply node and to output nodes of NAND gates 123, 124; and an inverter 126 receiving and inverting an output of NAND gate 125, and outputting self refresh stop signal SELF_STOP.

The signal SELF_1MSB is a mode signal that corresponds to a refresh mode of partial self refresh, in which self refresh operation is performed only in that memory area in which the most significant bit of the refresh row address signal is at the L level. The signal SELF_2MSB is a mode signal corresponding to a refresh mode of partial self refresh in which self refresh operation is performed only in that memory area in which the most and second most significant bits of the refresh row address signal are both at the L level. The signal SELFREF attains to the H level when the partial self refresh operation is performed. These signals are all generated by control circuit 24.

The self refresh stop signal SELF_STOP is output to control circuit 24, and when self refresh stop signal SELF_STOP is at the H level, control circuit 24 stops the refresh operation. When self refresh stop signal SELF_STOP is at the L level during the self refresh operation, control circuit 24 instructs execution of the refresh operation.

In this circuit, when the signals SELFREF and SELF_1MSB are both at the H level (signal SELF_2MSB is at the L level) and the signal QAD<11> is at the H level, the output of NAND gate 123 attains to the L level, and the self refresh stop signal SELF_STOP attains to the L level. Therefore, in the memory area in which the most significant bit of the refresh row address signal /QAD is at the L level, the refresh operation is executed. When the signal QAD<11> is at the L level, the output of NAND gate 123 attains to the H level, and the self refresh stop signal SELF_STOP attains to the H level. Therefore, in the memory area in which the most significant bit of the refresh row address signal /QAD is at the H level, the refresh operation is not executed.

When the signals SELFREF and SELF_2MSB are both at the H level (signal SELF_1MSB is at the L level) and the signals QAD<11> and QAD<10> are both at the H level, the output of NAND gate 124 attains to the L level, and the self refresh stop signal SELF_STOP attains to the L level. Therefore, in the memory area in which the most and the second most significant bits of refresh row address signal /QAD are both at the L level, the refresh operation is executed. When at least one of the signals QAD<11> and QAD:<10> is at the L level, the output of NAND gate 124 attains to the H level, and the self refresh stop signal SELF_STOP attains to the H level. Therefore, in that memory area in which both the most significant and the second most significant bits of refresh row address signal /QAD are not at the L level, the refresh operation is not executed.

As described above, in the semiconductor memory device 11 in accordance with the third embodiment, even when the most significant bit of the row address differ dependent on the mode of use, a prescribed partial memory area in which refresh operation is executed in the partial self refresh can be selected. Therefore, the partial self refresh can be executed appropriately in each mode of use.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a memory cell array including a plurality of memory cells arranged in a matrix of rows and columns;

a plurality of word lines arranged along the row direction;

a plurality of bit line pairs arranged along the column direction; and a decoder for selecting a word line and a bit line pair corresponding to an address signal specifying each of said plurality of memory cells among said plurality of word lines and said plurality of bit line pairs, respectively; wherein in a twin cell mode in which a twin cell mode signal is active, memory data corresponding to 1 bit of memory information represented as binary information is stored by using two memory cells, in a single cell mode in which said twin cell mode signal is inactive, said memory data corresponding to 1 bit of memory information is stored by using one memory cell, in said twin cell mode, said decoder selects the word line and the bit line pair for activating said two memory cells, and said two memory cells store said memory data and an inverted data of said memory data, respectively, said decoder generates an internal row address signal for selecting said word line corresponding to said address signal, and when said twin cell mode signal is activated, simultaneously selects a first word line corresponding to a prescribed bit of said internal row address signal which is at a first logic level, and a second word line corresponding to said prescribed bit which is at a second logic level, said prescribed bit is the least significant bit of said internal row address signal; and said decoder allocates the most significant bit of said address signal which is used in said single cell mode and is not used in said twin cell mode to the least significant bit of said internal row address signal, and allocates the least significant bit of said address signal to the most significant bit of said internal row address signal.

2. The semiconductor memory device according to claim 1, wherein in a normal operation mode in which said twin cell mode signal is inactive, storage capacity is 2×n (n is a natural number) bits and word configuration is 2×m (m is a natural number) bits; and when said twin cell mode signal is active, the storage capacity is n bits and the word configuration is 2×m bits.

3. A semiconductor memory device comprising:

a memory cell array including a plurality of memory cells arranged in a matrix of rows and columns;

a plurality of word lines arranged along the row direction;

a plurality of bit line pairs arranged along the column direction; and a decoder for selecting a word line and a bit line pair corresponding to an address signal specifying each of said plurality of memory cells among said plurality of word lines and said plurality of bit line pairs, respectively; wherein in a twin cell mode in which a twin cell mode signal is active, memory data corresponding to 1 bit of memory information represented as binary information is stored by using two memory cells, in a single cell mode in which said twin cell mode signal is inactive, said memory data corresponding to 1 bit of memory information is stored by using one memory cell, in said twin cell mode, said decoder selects the word line and the bit line pair for activating said two memory cells, and said two memory cells store said memory data and an inverted data of said memory data, respectively, said decoder generates an internal row address signal for selecting said word line corresponding to said address signal, and when said twin cell mode signal is activated, simultaneously selects a first word line corresponding to a prescribed bit of said internal row address signal which is at a first logic level, and a second word line corresponding to said prescribed bit which is at a second logic level, said semiconductor memory device further comprising a refresh control circuit configured for periodically executing a refresh operation for retaining said memory information; wherein said refresh control circuit executes said refresh operation either in a first refresh mode in which all the memory cells included in said memory cell array are refreshed by k (k is a natural number) refresh operations or a second refresh mode in which all the memory cells included in said memory cell array are refreshed by 2×k refresh operations;

said address signal includes at the most significant bit a refresh mode selection bit for selecting either said first or second refresh mode;

said prescribed bit is the least significant bit of said internal row address signal; and said decoder allocates said refresh mode selection bit to the least significant bit of said internal row address signal and allocates the least significant bit of said address signal to the most significant bit of said internal row address signal.

4. The semiconductor memory device according to claim 3, wherein in a normal operation mode in which said twin cell mode signal is inactive, storage capacity is 2×n (n is a natural number) bits and word configuration is 2×m (m is a natural number) bits, and when said twin cell mode signal is active, the storage capacity is n bits and the word configuration is m bits.

5. The semiconductor memory device according to claim 1, wherein said twin cell mode signal is externally input through a prescribed terminal.

6. The semiconductor memory device according to claim 1, further comprising a fuse circuit for switching logic level of said twin cell mode signal.

7. A semiconductor memory device comprising:

a memory cell array including a plurality of memory cells arranged in a matrix of rows and columns;

a plurality of word lines arranged along the row direction;

a plurality of bit line pairs arranged along the column direction; and a decoder for selecting a word line and a bit line pair corresponding to an address signal specifying each of said plurality of memory cells among said plurality of word lines and said plurality of bit line pairs, respectively; wherein in a twin cell mode in which a twin cell mode signal is active, memory data corresponding to 1 bit of memory information represented as binary information is stored by using two memory cells, in a signal cell mode in which said twin cell mode signal is inactive, said memory data corresponding to 1 bit of memory information is stored by using one memory cell, in said twin cell mode, said decoder selects the word line and the bit line pair for activating said two memory cells, and said two memory cells store said memory data and an inverted data of said memory data, respectively, said semiconductor memory device further comprising a refresh control circuit configured for periodically executing a refresh operation for retaining said memory information; wherein said refresh control circuit generates a refresh row address for designating a row of memory cells as an object of said refresh operation;

said refresh row address includes at least 1 bit of partial self refresh address bit for designating execution of said refresh operation on a partial area of said memory cell array as an object of said refresh operation; and said decoder includes a selecting circuit configured for selecting said at least 1 bit of partial self refresh address bit among said refresh row address which is different according to whether said twin cell mode signal is active or not.

8. The semiconductor memory device according to claim 7, wherein said refresh control circuit executes said refresh operation either in a first refresh mode in which all the memory cells included in said memory cell array are refreshed by k (k is a natural number) refresh operations or a second refresh mode in which all the memory cells included in said memory cell array are refreshed by 2×k refresh operations; and said selecting circuit selects, when said twin cell mode signal is inactivated and said refresh control circuit executes said refresh operation in said second refresh mode, said at least 1 bit of partial self refresh address bit among said refresh row address generated corresponding to said second refresh mode.

* * * * *